(12) United States Patent
Seel et al.

(10) Patent No.: US 11,892,483 B2
(45) Date of Patent: Feb. 6, 2024

(54) CURRENT MEASURING RESISTOR AND ASSOCIATED PRODUCTION METHOD

(71) Applicant: Isabellenhuette Heusler GmbH & Co. KG, Dillenburg (DE)

(72) Inventors: Benjamin Seel, Dillenburg-Eibach (DE); Jan Marien, Herborn (DE); Florian Bernhardt, Dillenburg-Manderbach (DE); Siegfried Herb, Siegen (DE); Michael Pollmann, Dillenburg (DE); Alexander Wassmann, Siegen (DE)

(73) Assignee: ISABELLENHUETTE MEUSLER GMBH & CO. KG, Dillenburg (DE)

( * ) Notice: Subject to any disclaimer, the term of this patent is extended or adjusted under 35 U.S.C. 154(b) by 470 days.

(21) Appl. No.: 17/270,754

(22) PCT Filed: Sep. 4, 2018

(86) PCT No.: PCT/EP2018/073686
§ 371 (c)(1),
(2) Date: Feb. 23, 2021

(87) PCT Pub. No.: WO2020/048584
PCT Pub. Date: Mar. 12, 2020

(65) Prior Publication Data
US 2021/0223296 A1  Jul. 22, 2021

(51) Int. Cl.
*G01R 19/10* (2006.01)
*G01K 7/16* (2006.01)
*H01C 17/00* (2006.01)

(52) U.S. Cl.
CPC ............... *G01R 19/10* (2013.01); *G01K 7/16* (2013.01); *H01C 17/00* (2013.01)

(58) Field of Classification Search
CPC .......... G01R 19/10; G01R 1/203; G01K 7/16; H01C 17/00
See application file for complete search history.

(56) References Cited

U.S. PATENT DOCUMENTS 2,708,701 A   5/1955   Viola
4,799,588 A   1/1989   Trisl
(Continued)

FOREIGN PATENT DOCUMENTS

DE   8510187 U1   5/1985
DE   19906276 A1   9/2000
(Continued)

OTHER PUBLICATIONS

International Search Report for International Application No. PCT/EP2018/073686 dated May 28, 2019.
(Continued)

*Primary Examiner* — Alvaro E Fortich
(74) *Attorney, Agent, or Firm* — Caesar Rivise, PC

(57) ABSTRACT

The invention relates to a current measuring resistor (1) for measuring an electrical current, in particular in the kA range, in a high-voltage network. The current measuring resistor (1) according to the invention comprises two connection parts (2, 3) for conducting the electrical current in and out and a resistance element (4) made of a low-impedance resistive material. The resistance element (4) is arranged between the two connection parts (2, 3) in the direction of current flow and is joined to the two connection parts (2, 3), such that the electrical current to be measured flows through the resistance element (4) during operation and produces a voltage drop across the resistance element (4). According to the invention, the connection parts (2, 3) and the resistance element (4) each have a substantially round cross section, in particular a substantially circular cross section, in a section
(Continued)

plane perpendicular to the direction of current flow of the electrical current.

34 Claims, 4 Drawing Sheets

(56)  References Cited

U.S. PATENT DOCUMENTS

| | | | |
|---|---|---|---|
| 6,489,693 | B1 | 12/2002 | Hetzler |
| 8,471,674 | B2 | 6/2013 | Yoshioka |
| 9,437,353 | B2 | 9/2016 | Hetzler |
| 10,151,779 | B2 | 12/2018 | Hetzler |
| 2004/0012480 | A1* | 1/2004 | Nakamura ............. H01C 1/144 338/328 |
| 2010/0003781 | A1* | 1/2010 | Van Duren ............. H01L 31/18 438/98 |
| 2016/0041206 | A1* | 2/2016 | Hetzler ................ G01R 35/005 324/126 |

FOREIGN PATENT DOCUMENTS

| | | | |
|---|---|---|---|
| DE | 112010004668 | T5 | 1/2013 |
| DE | 102012211701 | A1 | 3/2013 |
| DE | 102012013036 | A1 | 1/2014 |
| DE | 102013005939 | A1 | 10/2014 |
| EP | 0605800 | * 7/1994 | ............... H01C 1/14 |
| EP | 0605800 | A1 | 7/1994 |
| JP | 2009216620 | A | 9/2009 |
| WO | WO2007068409 | * 6/2007 | ............. G01R 19/00 |

OTHER PUBLICATIONS

English Abstract of DE 102012211701 (2013).
English Abstract of EP 0605800 (1994).
English Abstract of JP 2009216620 (2009).

* cited by examiner

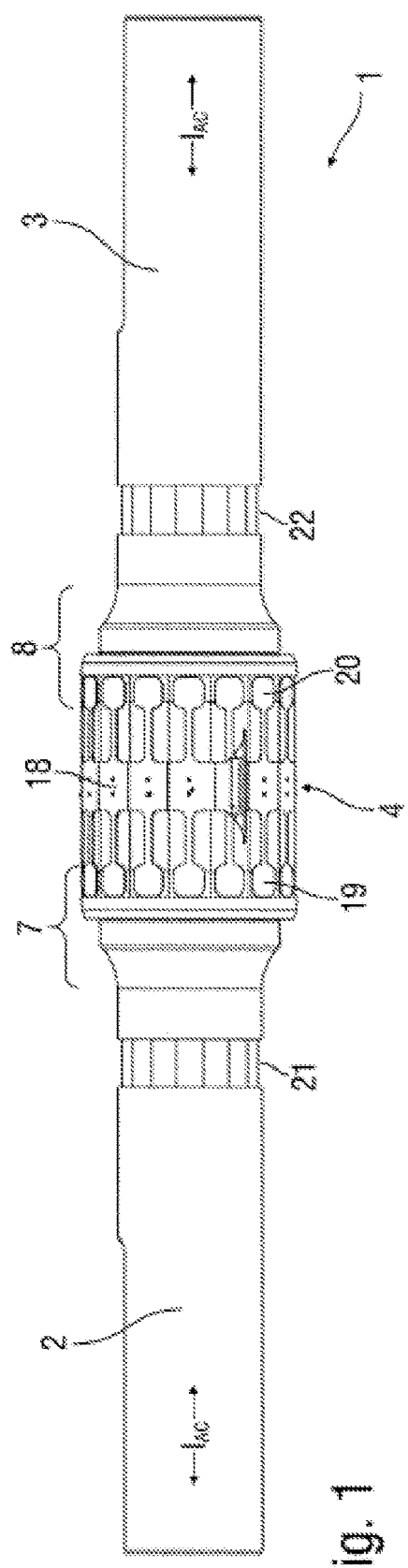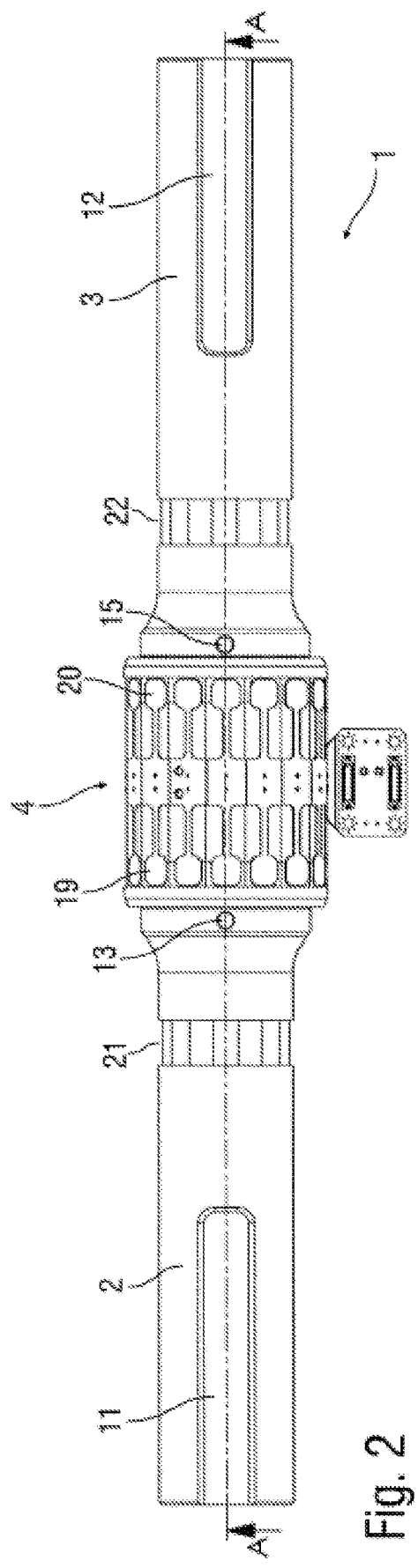

Section A-A

Detail view X

Detail view Z

CURRENT MEASURING RESISTOR AND ASSOCIATED PRODUCTION METHOD

CROSS-REFERENCE TO RELATED APPLICATIONS

This application is a U.S. National Phase Application of PCT/EP2018/073686, filed Sep. 4, 2018, the contents of which are incorporated herein by reference in their entireties for all purposes.

BACKGROUND OF THE INVENTION

The invention relates to a current measuring resistor for measuring an electric current, in particular in the kA (kilo-ampere) range in a high-voltage network. Furthermore, the invention relates to a corresponding manufacturing method for such a current network resistor.

Low-resistance current measuring resistors are known from the prior art (e.g. EP 0 605 800 A1), which enable current measurement according to the known four-wire technique. In this process, the current to be measured is passed through the low-resistance current measuring resistor and the voltage drop across the current measuring resistor is measured. According to Ohm's law, the voltage drop across the current measurement resistor is a measure of the electric current flowing through the current measurement resistor. The known current measuring resistors according to EP 0 605 800 A1 are usually cut from a composite material strip and therefore have a rectangular cross-section in a sectional plane at right angles to the direction of current flow. However, these known current measuring resistors are not suitable for current measurement of alternating currents in the kA range in a high-voltage network. The rectangular shape of the resistor leads to highly location- and frequency-dependent distributions of the amplitudes and phases, especially in the case of alternating currents.

The invention is therefore based on the task of specifying a correspondingly improved current measuring resistor and a manufacturing method therefor.

This task is solved by a current measuring resistor and a corresponding manufacturing method according to the invention.

BRIEF SUMMARY OF THE INVENTION

First of all, the current measuring resistor according to the invention has, in accordance with the known current measuring resistors described at the beginning, two connection parts made of a conductor material (e.g. copper) for introducing the electric current to be measured into the current measuring resistor and discharging it from the current measuring resistor, respectively.

Furthermore, in accordance with the prior art, the current measuring resistor according to the invention comprises a resistor element made of a low-resistance resistance material (e.g. Noventin®, i.e. $CuMnNi_{25-10}$), the resistor element being arranged in the direction of current flow between the two connection parts and being joined to the two connection parts so that, in operation, the electric current to be measured flows through the resistor element and generates a voltage drop across the resistor element, which forms a measure of the electric current to be measured.

The current measuring resistor according to the invention now differs from the known current measuring resistor described at the beginning in that the two connection parts and the resistor element each have a substantially round cross-section, in particular a substantially circular cross-section, in a sectional plane at right angles to the direction of flow of the electric current. This advantageously enables a constructive design of the current measuring resistor for measuring high alternating currents in the kA range in a high-voltage network.

The concept of a circular cross-section used in the context of the invention is not limited to an exactly circular cross-section in the mathematical-geometric sense. Rather, the cross-section may also be reproduced by a polygon having a plurality of corners, such as 16 corners. In any case, however, the current measuring resistor according to the invention differs from the known current measuring resistors with a square and rectangular cross-section described at the beginning. In a preferred embodiment, the cross-section of the connection parts and the resistor element is essentially circular and has only flattenings, which facilitate the manufacturing process or enable the mounting of a guide plate, as will be described in detail.

In the preferred embodiment of the invention, the round resistor element has a larger outer diameter than the two round connection parts, with the resistor element being arranged centrally between the two connection parts with respect to the direction of current flow. Here, the current measuring resistor between the two outer connection parts with the smaller outer diameter and the central resistor element with the larger outer diameter has a transition contour which can be smooth and kink-free in order to achieve a homogeneous current distribution. For example, the transition contour may also have a concave section.

Furthermore, it should be mentioned with regard to the transition contour that the transition contour is preferably located exclusively in the connection parts, while the outer diameter of the resistor element is substantially constant along its length. Alternatively, however, it is also possible that the transition contour also extends into the resistor element or is arranged exclusively in the resistor element.

It has already been mentioned above that the connection parts are joined to the resistor element, as is basically also the case with the known current measuring resistors described at the beginning.

In one variant of the invention, this connection between the resistor element on the one hand and the connection part on the other hand is made by electron beam welding, as is also known from the patent application EP 0 605 800 A1 already mentioned at the beginning. However, when producing such an electron beam welded joint, the electron beam must extend from the outer surface to the center of the current measuring resistor. However, this is relatively difficult due to the relatively large outer diameter of the current measuring resistor according to the invention, which is why an electron beam welded joint is not optimal.

In another, preferred variant of the invention, the connection between the resistor element on the one hand and the connection parts on the other is therefore made by hard soldering (e.g. vacuum hard soldering), which is preferably done in an oven which, with appropriate heating power, is capable of heating the workpieces (resistor element and connection parts) homogeneously and subjecting them to a specific temperature profile over time. Here, the cooling gradients and the cooling times also contribute to the quality of the hard soldered joint. As a rule, hard soldering also requires a certain pressure to be applied to the joint. However, in the case of the current measuring resistor according to the invention, the workpieces to be joined (resistor element and connection parts) have a relatively high inherent weight, so that additional external pressure on the workpieces is not usually necessary.

Preferably, the hard soldering is carried out as part of a vacuum hard soldering process, although such processes are known per se from the prior art and therefore need no longer be described.

Furthermore, it should be mentioned that the resistance material of the resistor element may contain manganese, which makes a good hard soldered joint difficult. Preferably, therefore, the joining surfaces of the resistor element are provided with a layered surface finish prior to joining (hard soldering), which may have nickel, nickel-phosphorus (NiP), gold or silver as ingredients, for example. The composition of the alloy or the additives to the nickel are decisive for the hard soldered joint. The more noble the nickel alloy, the faster it forms a passivation, which in turn makes soldering more difficult. This surface refinement enables a good solder joint despite a manganese-containing resistance material.

In the current measuring resistor according to the invention, a printed circuit board is preferably mounted on the outer surface of the current measuring resistor in order to measure the voltage drop across the resistor element. This printed circuit board is preferably a flexible printed circuit board (flex circuit board), which can be curved or bent in the circumferential direction according to the outer contour of the current measuring resistor.

The printed circuit board is preferably connected to the current measuring resistor by a welded joint, for example by an ultrasonic welded joint or a laser welded joint. The welded connection can, for example, be located only in the area of the connection parts, in order to also electrically and mechanically connect voltage taps on the inside of the printed circuit board with the connection parts there. Alternatively, however, it is also possible for the welded connection between the printed circuit board and the current measuring resistor to be located only in the area of the resistor element, in order to arrange the voltage taps inside the resistor element. Furthermore, there is also the possibility that the welded connection extends over both the connection parts and the resistor element. Alternatively, it is also possible to connect the printed circuit board to the current measuring resistor by a solder connection.

With regard to the printed circuit board, it should also be mentioned that the printed circuit board is preferably at least two-layered in order to be accessible from both sides.

Furthermore, the printed circuit board can also carry a temperature sensor for measuring the temperature of the resistor element, in particular an NTC resistor (NTC: negative temperature coefficient) or a PTC resistor (PTC: positive temperature coefficient). Alternatively, chip temperature sensors (Pt100, Pt1000, Ptx, 1-Wire, etc.) are also possible as temperature sensors.

In the preferred embodiment of the invention, not only a single pair of voltage taps is provided to measure the voltage drop across the resistor element. Rather, a plurality of pairs of voltage taps are preferably provided, arranged at different locations on the current measuring resistor, each providing a corresponding voltage reading. The pairs of voltage taps are preferably arranged distributed over the circumference of the current measuring resistor, preferably equidistantly. For example, the number of pairs of voltage taps may be greater than 2, 4, 8, 12 or 14, with exactly 16 pairs of voltage taps being provided in the preferred embodiment of the invention.

For example, the voltage taps can be attached directly to the printed circuit board and rest directly on the lateral surface of the connection parts. The voltage taps can then be attached to the side of the printed circuit board facing the current measurement resistor and contact the connection parts after the printed circuit board has been welded on. Preferably, however, the voltage taps are accessible through-plated on both sides of the printed circuit board.

It was briefly mentioned above that the individual pairs of voltage taps each provide a voltage measurement value. An average value can then be formed from the individual voltage measurement values, for example, which then forms the measure of the electric current flowing through the current measurement resistor. Preferably, however, weighting resistors are provided to weight the individual voltage measurement values, whereby a resulting measurement value is then determined from the weighted voltage measurement values. These weighting resistors can also be arranged on the printed circuit board.

The pairs of voltage taps are preferably connected to a measuring circuit which determines the voltage drop across the resistor element, the measuring circuit preferably calculating the voltage drop across the resistor element from the weighted voltage measured values. The measuring circuit is preferably not arranged on the printed circuit board itself, but on at least one separate measuring card, which is connected to the printed circuit board by a line.

The measuring circuit can also be connected to a data interface in order to transmit measured values of the voltage drop to an external evaluation unit. Preferably, this data interface is an electro-optical data interface, which transmits the measured values to the external evaluation unit via an optical fiber.

To create redundancy in the measurement, preferably at least two measurement boards are provided, each having a measurement circuit, the two measurement circuits being connected on the input side to the printed circuit board and receiving the voltage measurement values of the individual pairs of voltage taps.

The individual measuring circuits can each have at least two or at least three measuring paths, the individual measuring paths each receiving the measured values for the voltage drop across the resistor element from the printed circuit board. In the case of three measurement paths, the first two measurement paths can have the same signal amplification, for example, while the third measurement path has a lower signal amplification.

It has already been briefly mentioned above that the outer contour of the current measuring resistor does not have to be exactly round, but can have flattenings in the lateral surface in order to mount the printed circuit board plane-parallel on the flattening.

In the preferred embodiment of the invention, a plurality of flattenings are arranged in the lateral surface of the current measuring resistor distributed over the circumference of the current measuring resistor, and preferably more than 2, 4, 6, 8, 10, 12 or 14 flattenings. In the preferred embodiment, the current measuring resistor is a polygon with 16 flattenings in cross-section. Here, the printed circuit board is bent several times in accordance with the number of flattenings in the current measuring resistor and contains flat printed circuit board sections between the bends, each of which is mounted in a plane-parallel manner on one of the flattenings. In the embodiment example of the current measuring resistor according to the invention with 16 flattenings in the lateral surface of the current measuring resistor, the printed circuit board has correspondingly 16 flat printed circuit board sections, which then each lie plane-parallel on one of the flattenings.

It should be mentioned here that the flattenings preferably extend in the axial direction from the area of the resistor element into the areas of the adjacent connection parts.

The measuring circuit described above and further electronic components of the current measuring resistor require a power supply during operation, which in the case of the current measuring resistor according to the invention can in principle be provided in a conventional manner. However, in the preferred embodiment of the invention, the current measuring resistor has at least one coil for energy harvesting from the magnetic field of the current measuring resistor by energy harvesting. In operation, the electric current flowing through the current measuring resistor generates a magnetic field that passes through the energy harvesting coil, thereby enabling energy harvesting. This coil can then provide the electrical energy needed to operate the sensing circuit, either alone or with an additional energy supply. Preferably, the coil has at least 20, 50, 100 or 140 windings, with exactly 150 windings being provided in the preferred embodiment of the invention. Furthermore, the coil preferably includes a magnetic core which surrounds the connection parts in a ring shape and is wound with the coil. In the preferred embodiment of the invention, several coils are provided, each of which annularly surrounds one of the two connection parts.

In addition, a current storage device can also be integrated in the current measuring resistor, in particular at least one so-called power cap with a capacitance of at least 10 mF, 50 mF, 100 mF, 500 mF or at least 1,000 mF.

A photocell can also be integrated in the current measuring resistor for sole or supporting power supply.

The conductor material is preferably copper or a copper alloy, but other conductor materials are also possible within the scope of the invention. However, the conductor material of the connection parts should have a lower specific electrical resistance than the resistance material of the resistor element.

For example, the resistance material of the resistor element may be a copper-manganese-nickel alloy, in particular with 25% by weight manganese, 10% by weight nickel and the remainder copper or with 12% by weight manganese, 2% by weight nickel and the remainder copper.

The resistance material of the resistor element preferably has an electrical resistivity that is less than 1,000 μΩm (microohm·centimeter), 500 μΩcm, 250 μΩcm, 100 μΩcm or 50 μΩcm.

The conductor material of the connection parts, on the other hand, preferably has a specific electrical resistance that is smaller than 20 μΩcm, 10 μΩcm, 5 μΩcm or 2 μDem.

Furthermore, it should be mentioned that the resistor element, the first connection part and/or the second connection part are preferably solid without cavities. On the one hand, this is advantageous because cavities in the current measuring resistor could allow water to penetrate. On the other hand, the solid design of the current measuring resistor is also advantageous because the current measuring resistor according to the invention must have a large mass for sufficient short-circuit resistance, so that it can buffer the thermal power loss arising in the event of a short circuit without significantly changing the resistance value.

It should also be mentioned that the connection parts can each have an axially extending longitudinal groove in their lateral surface, which starts from the end face of the connection parts. These longitudinal grooves advantageously enable anti-rotation.

Furthermore, the two connection parts can each have an axially extending blind hole in their end faces, in particular with an internal thread, the blind hole preferably being arranged centrally and coaxially. This blind bore enables cables to be connected, for example.

In addition, the connection parts can each have at least one radially extending blind hole in their lateral surface for housing assembly, wherein this blind hole can be located, for example, in the transition contour of the current measuring resistor.

It has already been mentioned above that the current measuring resistor forms a polygon in cross-section in the area of the resistor element in order to be able to mount the PCB which has been folded in several times. Therefore, there are preferably corresponding ring grooves with a likewise polygonal cross-section in the same orientation in the circumferential direction in the connection parts. These ring grooves with the polygonal cross-section then serve as finishing aids in the automated assembly of the printed circuit board.

The current measuring resistor according to the invention also differs from the known current measuring resistors described at the beginning by the substantially larger dimensions, which are adapted to a current measurement in the kA range. The outer diameter of the round resistor element may therefore be at least 6 cm (centimeter), 7 cm, 8 cm or 9 cm, the outer diameter of the round resistor element in the preferred embodiment of the invention being substantially 10 cm. The outer diameter of the round connection parts, on the other hand, is preferably at least 2 cm, 3 cm, 4 cm or 5 cm and is thus substantially smaller than the outer diameter of the round resistor element.

In the axial direction, on the other hand, the current measuring resistor according to the invention preferably has a relatively large length of at least 10 cm, 20 cm, 30 cm, 40 cm, 50 cm or 60 cm, where the length of the current measuring resistor in the preferred embodiment example is essentially 64 cm.

The individual resistor element, on the other hand, preferably has an axial length in the direction of current flow of at least 1 cm, 2 cm, 3 cm, 4 cm, 5 cm or 6 cm, where the length of the resistor element in the preferred embodiment example is essentially 7 cm.

The individual connection parts thereby preferably have an axial length in the direction of current flow of at least 10 cm, 20 cm, 25 cm or 30 cm, the axial length of the individual connection parts being substantially 31 cm in the preferred embodiment example of the invention.

The mass of the connection parts and of the resistor element is also preferably substantially greater in the current measuring resistor according to the invention than in the known current measuring resistors described at the beginning, in order to permit sufficient current-carrying capacity and short-circuit strength. Thus, the connection parts each preferably have a mass of at least 1 kg (kilogram), 2 kg, 5 kg, 10 kg, 15 kg or 20 kg and, in the preferred embodiment example, essentially 22 kg. The resistor element, on the other hand, preferably has a mass of at least 0.5 kg, 1 kg, 1.5 kg or 2 kg, and in the preferred embodiment example the mass is substantially 2 kg.

The current measuring resistor according to the invention also differs from the known current measuring resistors in that it has a very high continuous current carrying capacity, which is at least 1 kA, 5 kA, 10 kA, 15 kA, 50 kA, 75 kA, 95 kA or even at least 100 kA for alternating current.

Furthermore, the current measuring resistor is also designed for a relatively high voltage level and is suitable for voltages of at least 1 kV (kilovolt, 5 kV, 10 kV, 50 kV, 110 kV, 220 kV or at least 380 kV for alternating current.

Furthermore, it should be mentioned that the invention does not only claim protection for the current measuring resistor according to the invention as a single component. Rather, the invention also claims protection for a corresponding manufacturing process. The individual process steps of the manufacturing process according to the invention already result from the above description, so that a separate description of the manufacturing process according to the invention can be dispensed with.

Other advantageous further embodiments of the invention are explained in more detail below together with the description of the preferred embodiments of the invention with reference to the figures. The figures show:

BRIEF DESCRIPTION OF THE DRAWINGS

FIG. 1 a side view of a current measuring resistor according to the invention,

FIG. 2 another side view of the current measuring resistor according to the invention from FIG. 1, FIG. 3 a sectional view according to sectional line A-A in FIG. 2, FIG. 4 a detailed view of the detail area Z in FIG. 3, FIG. 5 a detail view of the detail area X in FIG. 3, FIG. 6 a perspective exploded view of the current measuring resistor according to the invention.

DETAILED DESCRIPTION OF PREFERRED EMBODIMENTS

Figure 3:
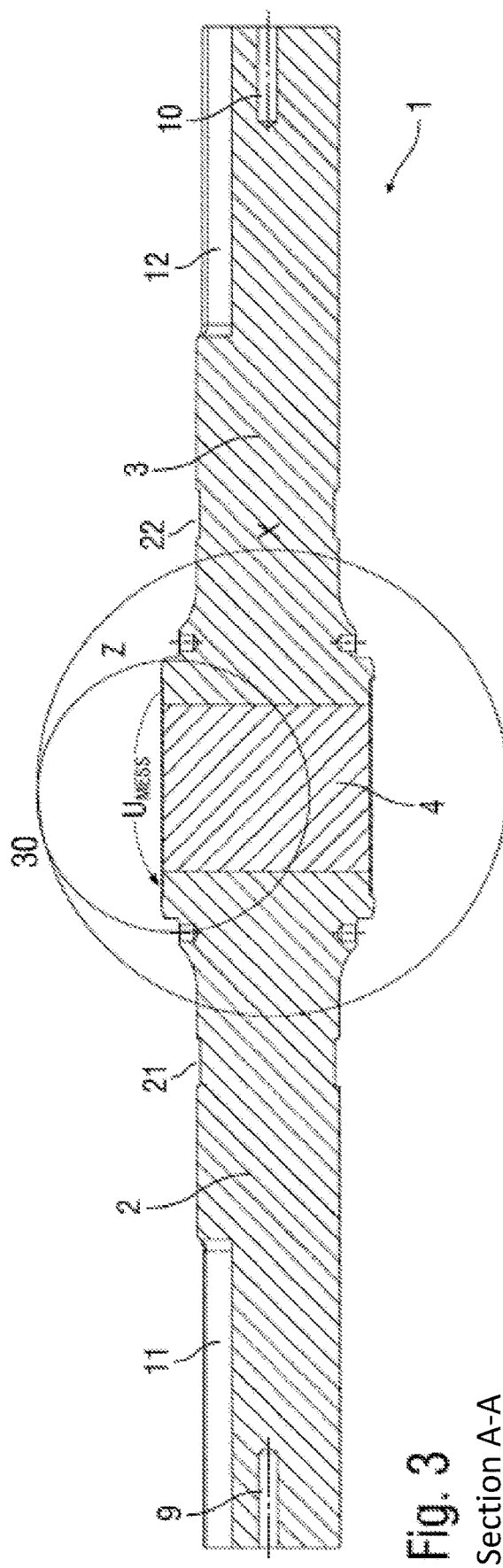
Figure 5:
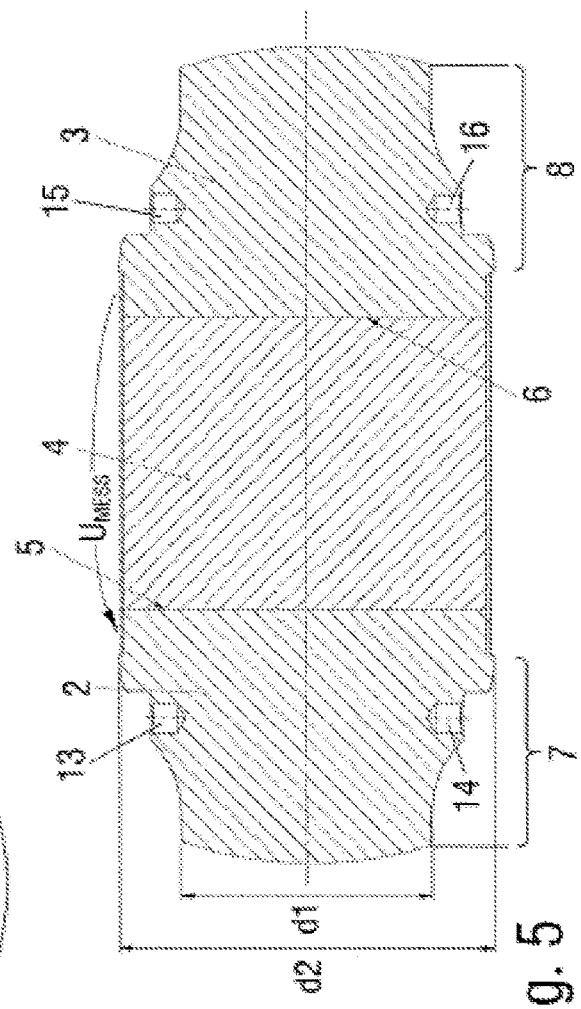
Figure 4:
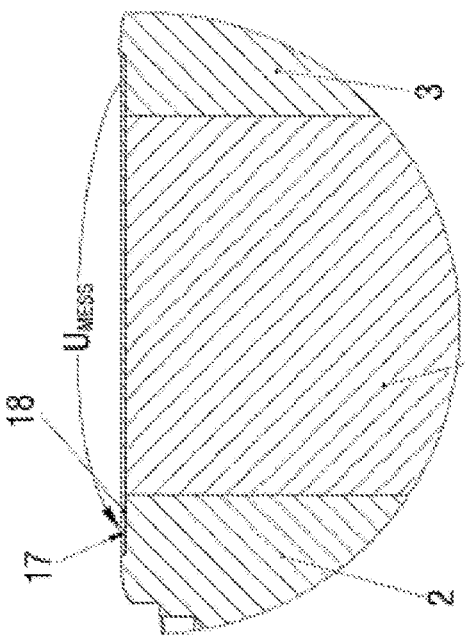

The drawings show an embodiment of a current measuring resistor 1 according to the invention, which can be used in high-voltage networks of, for example, 220 kV alternating current for current measurement in the kA range.

The current measuring resistor 1 initially has two connection parts 2, 3 made of copper, which serve to introduce an electric current $I_{AC}$ to be measured into the current measuring resistor 1 and to discharge it from the current measuring resistor 1, respectively.

In the direction of current flow between the two connection parts 2, 3, there is a resistor element 4 made of a resistance material (e.g. Noventin®, i.e. $CuMnNi_{25-10}$).

The resistor element 4 is joined at its two end faces to the two connection parts 2, 3 by a hard soldered joint. To enable this hard soldering process despite the otherwise disturbing manganese content of the resistance material, the resistor element 4 has a layered surface finish 5, 6 of nickel-phosphorus (NiP) on both joining surfaces. The surface finishes 5, 6 are applied before the soldered connection is made in order to enable or facilitate the subsequent soldering process despite the manganese content of the resistor element 4.

The connection parts 2, 3 and the resistor element 4 basically have a substantially circular cross-section, with a smaller diameter d1 in the area of the connection parts 2, 3 and a larger outer diameter d2 in the area of the resistor element 4. For diameter matching between the two outer diameters d1, d2, the connection part 2 has a transition contour 7, while the other connection part 3 has a corresponding transition contour 8. The two transition contours 7, 8 form the transition from the small outer diameter d1 of the connection parts 2, 3 to the larger outer diameter d2 of the resistor element 4. It should be mentioned here that the two transition contours 7, 8 each have a concave section in order to ensure a current density that is as homogenous as possible even within the transition contours 7, 8.

In the end faces of the two connection parts 2, 3, there is in each case a coaxial, centric blind hole 9, 10 with an internal thread, the two blind holes 9, 10 in each case allowing cables to be connected.

In addition, the two connection parts 2, 3 each have a longitudinal groove 11, 12 in their lateral surface, which enables anti-rotation.

Furthermore, in the transition contours 7, 8 of the two connection parts 2, 3 there are several radially extending blind holes 13, 14, 15 and 16, which enable housing assembly, as will be explained in detail.

The cross-section of the resistor element 4 and the adjacent areas of the two connection parts 2, 3 is not exactly circular. Rather, the current measuring resistor 1 has a total of sixteen flattenings 17 in the center, which are arranged equidistantly distributed over the circumference. The resistor element 4 thus has a polygonal cross-section with sixteen corners in a cross-section at right angles to the direction of current flow. The flattenings 17 serve for mounting a flexible printed circuit board 18, which is bent several times according to the number of flattenings 17. Between the individual bends of the printed circuit board 18 there are flat printed circuit board sections, each of which rests in a plane-parallel manner on one of the flattenings 17.

On its inner side facing the connection parts 2, 3, the printed circuit board 18 has sixteen pairs of voltage taps 19, 20, which are plated through and rest on the connection parts 2, 3 and therefore each measure the voltage drop across the resistor element 4 in pairs.

The printed circuit board 18 with the voltage taps 19, 20 is connected to the connection parts 2, 3 by an ultrasonic welding connection.

In the two connection parts 2, 3 there are also two annular grooves 21, 22, which also have a polygonal cross-section with sixteen corners. This polygonal cross-section of the annular grooves 21, 22 enables exact angular alignment during automated production and serves as a production aid during assembly of the printed circuit board 18.

It has already been mentioned above that the current measuring resistor 1 is used for high current measurement in a high voltage network. In order to achieve sufficient current carrying capacity and a correspondingly high short-circuit strength, the current measuring resistor 1 has large dimensions and relatively large masses. Thus, the overall axial length of the current measuring resistor 1 is 640 mm. The connection parts 2, 3 each have a mass of about 18-22 kg, while the mass of the resistor element 4 is about 2.5 kg. The outer diameter d2 is about 10 cm, while the outer diameter d1 of the connection parts 2, 3 is correspondingly smaller.

Figure 6:
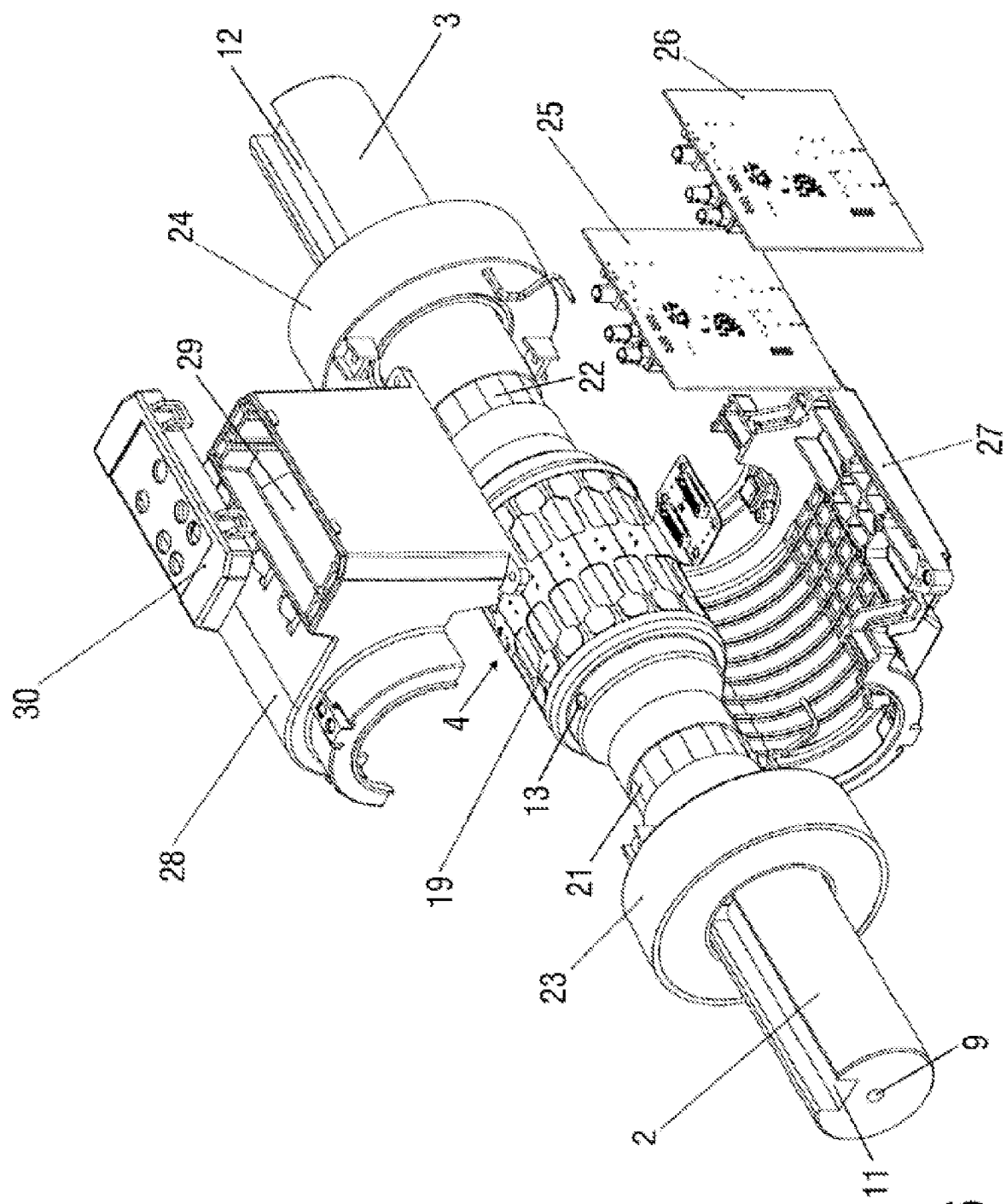

The exploded view in FIG. 6 further shows that the connection parts 2, 3 are each surrounded by an energy harvesting coil 23, 24, which obtains electrical energy from the magnetic field of the current measuring resistor 1 to operate measuring circuits.

The measuring circuits are redundantly arranged on two measuring cards 25, 26, which are connected to the lead plate 18 by a line.

Furthermore, it should be mentioned that the printed circuit board 18 additionally carries weighting resistors in addition to the voltage taps 19, 20 in order to weight the voltage measurement values of the individual pairs of voltage taps 19, 20. The weighted voltage measurement values are then passed from the printed circuit board 18 via the line to the two measurement cards 25, 26, where they are processed.

The measurement cards 25, 26 also carry an electro-optical data interface for transmitting measurement data to an external evaluation unit via an optical fiber.

Furthermore, it can be seen from the exploded view that the current measuring resistor 1 has two housing parts 27, 28 which can be attached to the blind holes 13-16 in the current measuring resistor 1.

The housing part 28 here forms a slide-in compartment 29 for the two measuring cards 25, 26, wherein the slide-in compartment 29 can be closed by a cover 30.

Figure 7:
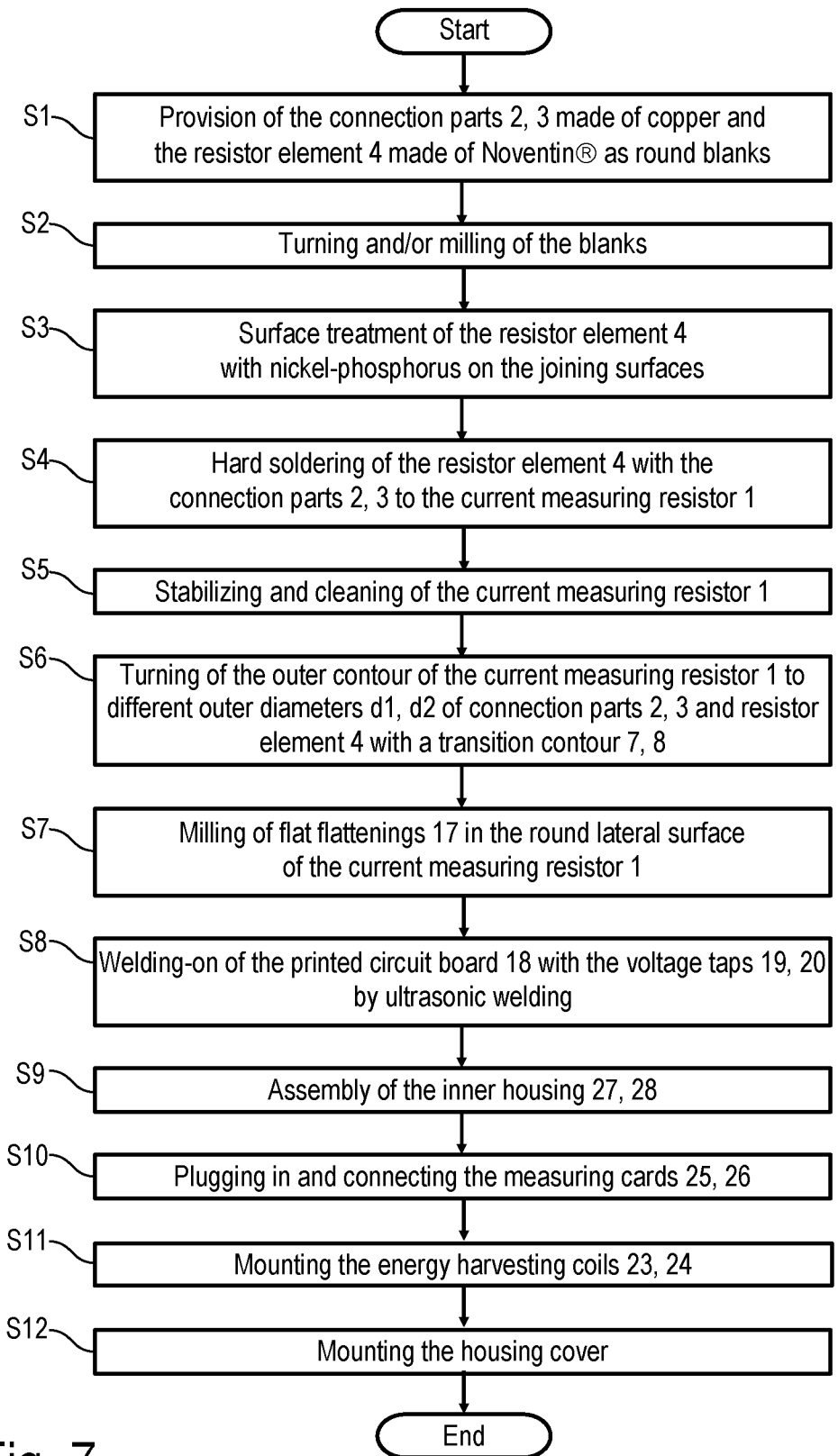
FIG. 7 shows the manufacturing process according to the invention in the form of a flow chart.

In the following, the manufacturing process according to the invention is described with reference to the flow chart according to FIG. 7.

In a first step S1, the two connection parts 2, 3 made of copper and the resistor element 4 made of Noventin® are first provided as round blanks.

In a further step S2, the blanks are then turned and/or milled.

In the next step S3, the surface finishing of the resistor element is then carried out on the joining surfaces in order to apply the surface finish 5, 6.

After this surface finishing, the hard soldering process can then begin in a step S4 to join the resistor element 4 to the connection parts 2, 3.

In a next step S5, the current measuring resistor 1 is then stabilized and cleaned.

Then, in a step S6, the current measuring resistor 1 is turned to achieve the desired outer contour with outer diameters d1, d2.

In a further step S7, the flattenings 17 are then milled into the round outer surface of the current measuring resistor 1.

Then, in a step S8, the printed circuit board 18 is attached to the outer surface of the current measuring resistor 1 by ultrasonic welding.

In a step S9, a housing consisting of the two housing parts 27, 28 is then mounted.

Then, in a step S10, the two measuring cards 25, 26 are inserted into the slide-in compartment 29.

Then in a step S11 the assembly of the energy harvesting coils 23, 24 takes place.

Finally, in a step S12, the assembly of the housing cover is then carried out.

The invention is not limited to the preferred embodiments described above. Rather, a large number of variants and variations are possible which also make use of the idea of the invention and therefore fall within the scope of protection. In particular, the invention also claims protection for the subject matter and the features of the dependent claims independently of the respective claims referred to and also without the features of the main claim. Thus, the invention comprises various aspects which enjoy protection independently of each other. For example, many aspects of the invention are also conceivable for current measuring resistors which do not have a round cross-section.

LIST OF REFERENCE SIGNS

1 Current measuring resistor
2, 3 Connection parts for the introduction or removal of the current to be measured
4 Resistor element
5, 6 Surface finish on the joining surfaces of the resistor element
7, 8 Transition contour between connection parts and resistor element
9, 10 Axial blind holes in the end faces of the connection parts
11, 12 Longitudinal grooves in the connection parts
13-16 Blind holes for housing assembly
17 Flattening
18 Flexible printed circuit board
19, 20 Voltage taps
21, 22 Annular grooves in the connection parts
23, 24 Energy harvesting coil for energy recovery by energy harvesting
25, 26 Measuring cards
27, 28 Housing parts
29 Slide-in compartment 29
30 Cover of the insertion compartment
d1 Diameter in the area of the connection parts
d2 Diameter in the area of the resistor element

The invention claimed is:

1. A current measuring resistor for measuring an electric current, comprising:
  a) a first connection part comprising a conductor material for introducing the electric current into the current measuring resistor,
  b) a second connection part comprising a conductor material for conducting the electric current out of the current measuring resistor, and
  c) a resistor element comprising a low-resistance resistance material, the resistor element being arranged in a direction of current flow between the first connection part and the second connection part and being joined to the first and second connection parts so that the electric current to be measured flows through the resistor element during operation and produces a voltage drop across the resistor element,
wherein:
  d) the first connection part, the second connection part and the resistor element each have a substantially round cross-section in a sectional plane at right angles to the direction of flow of the electric current,
  e) the resistor element has an outer diameter which is larger than the outer diameter of the first and second connection parts,
  f) the resistor element is arranged centrally between the first and second connection parts with respect to the current flow direction, and
  g) the current measuring resistor has a transition contour between the first and second connection parts with a smaller outer diameter and the central resistor element with a larger outer diameter.

2. The current measuring resistor according to claim 1, wherein the first connection part, the second connection part and the resistor element each have a substantially circular cross-section, in the sectional plane at right angles to the direction of flow of the electric current.

3. The current measuring resistor according to claim 1, wherein the transition contour is smooth and kink-free in order to achieve a homogeneous current distribution.

4. The current measuring resistor according to claim 1, wherein the transition contour is located exclusively in the first and second connection parts.

5. The current measuring resistor according to claim 1, wherein the transition contour is at least partially concave.

6. The current measuring resistor according to claim 1, wherein the resistor element is joined to the first connection part and to the second connection part by one of the following connection types:
  a) Soldered connection,
  b) Welded connection.

7. The current measuring resistor according to claim 1, wherein the resistor element has a layered surface finish at joints to the first and second connection parts.

8. The current measuring resistor according to claim 7, wherein the layered surface finish comprises an ingredient selected from the group consisting of:
   a) nickel,
   b) nickel-phosphorus,
   c) gold, and
   d) silver.

9. The current measuring resistor according to claim 1, wherein a printed circuit board is attached to an outer surface of the current measuring resistor in order to measure the voltage drop across the resistor element.

10. The current measuring resistor according to claim 9, wherein the printed circuit board is arranged in an axial direction in a region of the resistor element and extends in the axial direction on both sides as far as over an outer surface of the first and second connection parts.

11. A current measuring resistor for measuring an electric current, comprising:
   a) a first connection part comprising a conductor material for introducing the electric current into the current measuring resistor,
   b) a second connection part comprising a conductor material for conducting the electric current out of the current measuring resistor, and
   c) a resistor element comprising a low-resistance resistance material, the resistor element being arranged in a direction of current flow between the first connection part and the second connection part and being joined to the first and second connection parts so that the electric current to be measured flows through the resistor element during operation and produces a voltage drop across the resistor element,
   wherein:
   d) the first connection part, the second connection part and the resistor element each have a substantially round cross-section in a sectional plane at right angles to the direction of flow of the electric current,
   e) a printed circuit board is attached to an outer surface of the current measuring resistor in order to measure the voltage drop across the resistor element, and
   f) the printed circuit board is a flexible printed circuit board which is curved or bent in a circumferential direction in accordance with an outer contour of the current measuring resistor.

12. The current measuring resistor according to claim 9, wherein the printed circuit board is connected to the current measuring resistor by a solder joint or a weld joint.

13. The current measuring resistor according to claim 12, wherein the weld joint is an ultrasonic welding connection or a laser welded connection.

14. The current measuring resistor according to claim 12, wherein the weld joint is is-located in the region of the first and second connection parts or in the region of the resistor element.

15. The current measuring resistor according to claim 9, wherein the printed circuit board has at least two printed circuit board layers.

16. The current measuring resistor according to claim 9, wherein the printed circuit board also carries a temperature sensor for measuring a temperature of the resistance material.

17. The current measuring resistor according to claim 9, wherein
   a) several pairs of voltage taps are provided, each pair of voltage taps measuring the voltage drop across the resistor element and providing a corresponding voltage reading, and
   b) the pairs of voltage taps are distributed over a circumference of the current-measuring resistor in order to measure the voltage drop across the resistor element at a plurality of different points distributed over the circumference of the current-measuring resistor.

18. The current measuring resistor according to claim 17, wherein the number of pairs of voltage taps is greater than 4.

19. The current measuring resistor according to claim 17, wherein the voltage taps are attached directly to the printed circuit board and rest directly on an outer surface of the first and second connection parts.

20. The current measuring resistor according to claim 17, wherein the pairs of voltage taps are each connected to weighting resistors in order to weight the individual voltage measurement values in accordance with the resistance value of the weighting resistors.

21. The current measuring resistor according to claim 20, wherein the weighting resistors are arranged on the printed circuit board.

22. A current measuring resistor for measuring an electric current, comprising:
   a) a first connection part comprising a conductor material for introducing the electric current into the current measuring resistor,
   b) a second connection part comprising a conductor material for conducting the electric current out of the current measuring resistor, and
   c) a resistor element comprising a low-resistance resistance material, the resistor element being arranged in a direction of current flow between the first connection part and the second connection part and being joined to the first and second connection parts so that the electric current to be measured flows through the resistor element during operation and produces a voltage drop across the resistor element,
   wherein:
   d) the first connection part, the second connection part and the resistor element each have a substantially round cross-section in a sectional plane at right angles to the direction of flow of the electric current,
   e) a printed circuit board is attached to an outer surface of the current measuring resistor in order to measure the voltage drop across the resistor element,
   f) several pairs of voltage taps are provided, each pair of voltage taps measuring the voltage drop across the resistor element and providing a corresponding voltage reading,
   g) the pairs of voltage taps are distributed over a circumference of the current-measuring resistor in order to measure the voltage drop across the resistor element at a plurality of different points distributed over the circumference of the current-measuring resistor,
   h) the pairs of voltage taps are connected to a measuring circuit which determines the voltage drop across the resistor element from the measured values,
   i) the measuring circuit calculates the voltage drop across the resistor element from the weighted voltage measured values,
   j) the measuring circuit is not arranged on the printed circuit board but on at least one separate measuring card which is connected to the printed circuit board by a line, k) the measuring circuit is connected to a data interface in order to transmit measured values of the voltage drop to an external evaluation unit, and
l) the data interface is an electro-optical data interface which transmits the measured values to the external evaluation unit via an optical waveguide.

23. The current measuring resistor according to claim 22, wherein
a) in order to create redundancy in the measurement, two measurement cards are provided, each of which has a measurement circuit,
b) the measuring circuit has at least two measuring paths, where each of the at least two measuring paths receives the measured values for the voltage drop across the resistor element from the printed circuit board, and
c) a first measurement path and a second measurement path have the same signal amplification, while a third measurement path has a lower signal amplification.

24. The current measuring resistor according to claim 9, wherein an essentially round outer contour of the current-measuring resistor has at least one flat flattening in a lateral surface of the current-measuring resistor in order to mount the printed circuit board in a plane-parallel manner on the at least one flat flattening.

25. A current measuring resistor for measuring an electric current, comprising:
a) a first connection part comprising a conductor material for introducing the electric current into the current measuring resistor,
b) a second connection part comprising a conductor material for conducting the electric current out of the current measuring resistor, and
c) a resistor element comprising a low-resistance resistance material, the resistor element being arranged in a direction of current flow between the first connection part and the second connection part and being joined to the first and second connection parts so that the electric current to be measured flows through the resistor element during operation and produces a voltage drop across the resistor element,
wherein:
d) the first connection part, the second connection part and the resistor element each have a substantially round cross-section in a sectional plane at right angles to the direction of flow of the electric current,
e) a printed circuit board is attached to an outer surface of the current measuring resistor in order to measure the voltage drop across the resistor element,
f) an essentially round outer contour of the current-measuring resistor has at least one flat flattening in a lateral surface of the current-measuring resistor in order to mount the printed circuit board in a plane-parallel manner on the at least one flat flattening,
g) a plurality of flattenings are distributed over a circumference of the current-measuring resistor in the lateral surface of the current-measuring resistor,
h) the flattenings are located in an outer surface of the resistor element,
i) the flattenings extend in the direction of current flow on both sides into the first and second connection parts, and
j) the printed circuit board is bent several times in accordance with the number of flattenings and has a plurality of flat printed circuit board sections which are each mounted plane-parallel on one of the flattenings.

26. The current measuring resistor according to claim 22, wherein a) at least one coil is provided for energy harvesting from a magnetic field of the current measuring resistor by energy harvesting, and
b) the at least one coil supplies electrical energy required for operating the measuring circuit.

27. The current measuring resistor according to claim 26, wherein
c) the at least one coil has at least 20 windings,
d) the at least one coil contains a magnetic core, and
e) for energy harvesting, a plurality of coils are provided, each of which annularly surrounds one of the first and second connection parts.

28. The current measuring resistor according to claim 26, wherein a current storage device is integrated into the current measuring resistor.

29. A current measuring resistor for measuring an electric current, comprising:
a) a first connection part comprising a conductor material for introducing the electric current into the current measuring resistor,
b) a second connection part comprising a conductor material for conducting the electric current out of the current measuring resistor, and
c) a resistor element comprising a low-resistance resistance material, the resistor element being arranged in a direction of current flow between the first connection part and the second connection part and being joined to the first and second connection parts so that the electric current to be measured flows through the resistor element during operation and produces a voltage drop across the resistor element,
d) wherein the first connection part, the second connection part and the resistor element each have a substantially round cross-section in a sectional plane at right angles to the direction of flow of the electric current and, wherein a photocell is integrated into the current measuring resistor for a sole or supporting power supply.

30. A current measuring resistor for measuring an electric current, comprising:
a) a first connection part comprising a conductor material for introducing the electric current into the current measuring resistor,
b) a second connection part comprising a conductor material for conducting the electric current out of the current measuring resistor, and
c) a resistor element comprising a low-resistance resistance material, the resistor element being arranged in a direction of current flow between the first connection part and the second connection part and being joined to the first and second connection parts so that the electric current to be measured flows through the resistor element during operation and produces a voltage drop across the resistor element,
wherein:
d) the first connection part, the second connection part and the resistor element each have a substantially round cross-section in a sectional plane at right angles to the direction of flow of the electric current,
e) the conductor material is copper or a copper alloy,
f) the conductor material of the first and second connection parts has a lower specific electrical resistance than the resistance material of the resistor element,
g) the resistance material of the resistor element is a copper-manganese-nickel alloy, h) the resistance material of the resistor element has a resistivity of less than 1000 μSΩ cm (microohm·centimeter),
i) the conductor material has a specific electrical resistance of less than 20 μΩcm,
j) at least one of the resistor element, the first connection part and the second connection part are of solid construction without cavities,
k) the first and second connection parts each have an axially extending longitudinal groove in their lateral surface, which groove starts from an end face of the first and second connection parts,
l) the first and second connection parts each have in their lateral surface at least one radially extending blind bore for housing assembly,
m) the first and second connection parts each have in their end face an axially running blind bore,
n) the first and second connection parts each have in their lateral surface a circumferential annular groove with a polygonal cross section which serves as a manufacturing aid,
o) an outer diameter of the round resistor element is at least 6 cm (centimeter),
p) an outer diameter of the round connection parts is at least 2 cm,
q) the current measuring resistor has an axial length in the direction of current flow of at least 10 cm,
r) the resistor element has an axial length in the direction of current flow of at least 1 cm,
s) the first and second connection parts each have an axial length in the direction of current flow of at least 10 cm,
t) the first and second connection parts each have a mass of at least 1 kg (kilogram),
u) the resistor element has a mass of at least 0.5 kg,
v) the current measuring resistor has a continuous current carrying capacity of at least 1 kA (kiloampere),
w) the current measuring resistor is suitable for a voltage level of at least 1 kV (kilovolt) for alternating current, and
x) at least one of the first connection part, the second connection part and the resistor element each have a polygonal cross-section in a sectional plane at right angles to the direction of flow of the electric current, with at least 12 corners to form the substantially round cross-section.

31. A manufacturing method for a current measuring resistor, comprising the following steps:
a) providing a first connection part comprising a conductor material for introducing an electric current into the current measuring resistor,
b) providing a second connection part comprising a conductor material for conducting the electric current out of the current measuring resistor,
c) providing a resistor element comprising a low-resistance resistance material,
d) joining the resistor element to the first and second connection parts to form the current-measuring resistor, so that the resistor element is arranged in a direction of current flow between the first connection part and the second connection part and the electric current to be measured flows through the resistor element during operation and generates a voltage drop across the resistor element,
e) mounting a printed circuit board for measuring the voltage drop across the resistor element on an outer surface of the resistor element,
f) mounting a housing on the current measuring resistor, the housing enclosing; the resistor element,
g) inserting at least one measuring card into the housing, the measuring card measuring the voltage drop across the resistor element,
h) mounting of at least one coil for energy harvesting from a magnetic field of the current measuring resistor by energy harvesting, and
i) mounting of a housing cover on the current measuring resistor,
j) wherein the first connection part, the second connection part and the resistor element each have a substantially round cross-section in a sectional plane at right angles to the direction of current flow.

32. The manufacturing method according to claim 31, wherein the joining of the resistor element to the first and second connection parts is effected by one of the following joining methods:
a) soldering,
b) welding.

33. The manufacturing method according to claim 32, further comprising the following step before joining the resistor element to the first and second connection parts:
surface finishing of a joining surface.

34. The manufacturing process according to claim 31, further comprising the following steps after joining the resistor element to the first and second connection parts:
a) shaping an outer contour of the current measuring resistor, and
b) forming at least one flat flattening in a lateral surface of the current measuring resistor for plane-parallel mounting of a printed circuit board on the at least one flat flattening.

* * * * *